US010629101B2

(12) United States Patent
Smith et al.

(10) Patent No.: US 10,629,101 B2
(45) Date of Patent: Apr. 21, 2020

(54) DISPLAY WITH SELECTIVITY ILLUMINATED SERIFS

(71) Applicant: C-M Glo, LLC, Watertown, WI (US)

(72) Inventors: Heather J. Smith, Juneau, WI (US); Andrew Weber, Oconomowoc, WI (US)

(73) Assignee: C-M GLO, LLC, Watertown, WI (US)

( * ) Notice: Subject to any disclaimer, the term of this patent is extended or adjusted under 35 U.S.C. 154(b) by 0 days.

(21) Appl. No.: 16/256,255

(22) Filed: Jan. 24, 2019

(65) Prior Publication Data

US 2019/0228687 A1 Jul. 25, 2019

Related U.S. Application Data

(60) Provisional application No. 62/621,138, filed on Jan. 24, 2018.

(51) Int. Cl.

| | |
|---|---|
| ***G09F 9/302*** | (2006.01) |
| ***G09F 9/33*** | (2006.01) |
| ***G09F 13/00*** | (2006.01) |
| ***H05K 5/00*** | (2006.01) |
| ***G09G 3/32*** | (2016.01) |
| ***G09G 3/18*** | (2006.01) |
| ***G09G 3/14*** | (2006.01) |
| ***G09G 3/04*** | (2006.01) |

(52) U.S. Cl.

CPC .............. *G09F 9/3023* (2013.01); *G09F 9/33* (2013.01); *G09F 13/005* (2013.01); *G09G 3/04* (2013.01); *G09G 3/14* (2013.01); *G09G 3/18* (2013.01); *G09G 3/32* (2013.01); *H05K 5/0017* (2013.01)

(58) Field of Classification Search

CPC ......... G09G 3/04; G09F 9/302; G09F 9/3023; G09F 9/30; G02F 1/134327

See application file for complete search history.

(56) References Cited

U.S. PATENT DOCUMENTS

| | | | |
|---|---|---|---|
| 3,782,016 | A | 1/1974 | Ashton et al. |
| 5,753,900 | A | 5/1998 | Goodwin, III et al. |
| 6,317,184 | B1 | 11/2001 | Kwan et al. |
| 7,880,755 | B1 | 2/2011 | Potash et al. |
| 9,940,855 | B2 | 4/2018 | Kaoh |
| 2003/0072168 | A1 | 4/2003 | Hou et al. |
| 2003/0156038 | A1 | 8/2003 | Hankins et al. |
| 2004/0233220 | A1 | 11/2004 | Decaux et al. |
| 2004/0246203 | A1 | 12/2004 | Nakaoka |
| 2005/0102870 | A1 | 5/2005 | Catteau et al. |
| 2005/0134529 | A1 | 6/2005 | Lei et al. |
| 2006/0001598 | A1 | 1/2006 | Lei et al. |
| 2008/0028649 | A1 | 2/2008 | Van Ness |
| 2013/0255116 | A1 | 10/2013 | Kaoh |

(Continued)

*Primary Examiner* — Laurence J Lee

(74) *Attorney, Agent, or Firm* — Boyle Fredrickson, S.C.

(57) ABSTRACT

An illuminated display with a display area having a plurality of numeric arrays formed of individual light emitting segments, and an alphanumeric array formed of individual light emitting segments and two light emitting serifs. The segments of the numeric arrays may be individually illuminated to collectively displays a single digit number in each array. The segments of the alphanumeric array may be individually illuminated to collectively displays a single digit number in the array or in combination with the serifs of the alphanumeric array to collectively displays a capital letter "B" in the alphanumeric array.

20 Claims, 11 Drawing Sheets

(56) References Cited

U.S. PATENT DOCUMENTS

| | | | | |
|---|---|---|---|---|
| 2014/0335976 | A1 | 11/2014 | Hiller et al. | |
| 2016/0042673 | A1 | 2/2016 | Wilson et al. | |
| 2017/0084209 | A1 * | 3/2017 | Kaoh | G09F 9/3023 |

* cited by examiner

DISPLAY WITH SELECTIVITY ILLUMINATED SERIFS

CROSS-REFERENCE TO RELATED APPLICATIONS

This application claims priority to U.S. provisional application Ser. No. 62/621,138, filed Jan. 24, 2018, the entire contents of which is incorporated herein by reference.

BACKGROUND OF THE INVENTION

1. Technical Field

The present disclosure generally relates to an illuminated display, and more particularly to an illuminated display having a digit that can display individual numbers or a capital letter "B" through the selective illumination of serifs.

2. Background Art

Illuminated signs, such as those used to display lottery jackpot values, are common place in retailers including gas stations, convenience stores and grocery stores. Typically, these electronic displays include two or more digits that may be selectively illuminated to display the approximate current lottery jackpot value. Previously, lottery jackpot values did not frequently extend beyond the hundreds of millions of dollars, and as such three-digit displays were sufficient to display the jackpot value, in millions of dollars. However, as lottery jackpot values have more frequently grown above one billion dollars, current signs are not well suited for accurately displaying such large values. Accordingly, there is a need to develop an illuminated display, and particularly a lottery jackpot display that maintains the general size and shape of a traditional multi-digit sign, and that provides traditional display of lottery jackpots in the millions of dollars as well as effective display of an approximate lottery jackpot greater than or equal to one billion dollars.

SUMMARY OF THE INVENTION

In one embodiment of the present invention, an illuminated display is provided having a housing defining a display area and an alphanumeric array in the display area. The alphanumeric array may comprise a multitude of individual light emitting segments, wherein selective illumination of segments collectively displays a single digit number in the alphanumeric array, and a first and second light emitting serif, wherein illumination of the segments of the alphanumeric array in combination with illumination of the first and second light emitting serifs displays a capital letter "B" in the alphanumeric array.

In another aspect of the invention the display area includes a plurality of numeric array which each comprise a multitude of individual light emitting segments, wherein selective illumination of segments collectively displays a single digit number in each array.

In another aspect of the invention, the plurality of numeric arrays may comprise a first and second numerical array In another aspect of the invention, the display may further include at least one light emitting decimal point.

In another aspect of the invention, the plurality of numeric arrays and the alphanumeric array may be formed of a plurality of LEDs disposed within a dot matrix panel.

In another aspect of the invention, the first light emitting serif may be disposed at a corner defined by an intersection of a left edge of the alphanumeric array and a top edge of the alphanumeric array.

In another aspect of the invention, the second light emitting serif may be disposed at a corner defined by an intersection of a left edge of the alphanumeric array and a bottom edge of the alphanumeric array.

In another aspect of the invention, the first and second serifs are irregular polygons.

Further aspects or embodiments of the present invention will become apparent from the ensuing description, which is given by way of example only.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore, non-limiting embodiments illustrated in the drawings accompanying and forming a part of this specification, wherein like reference numerals designate the same elements in the several views, and in which.

Figure 1:
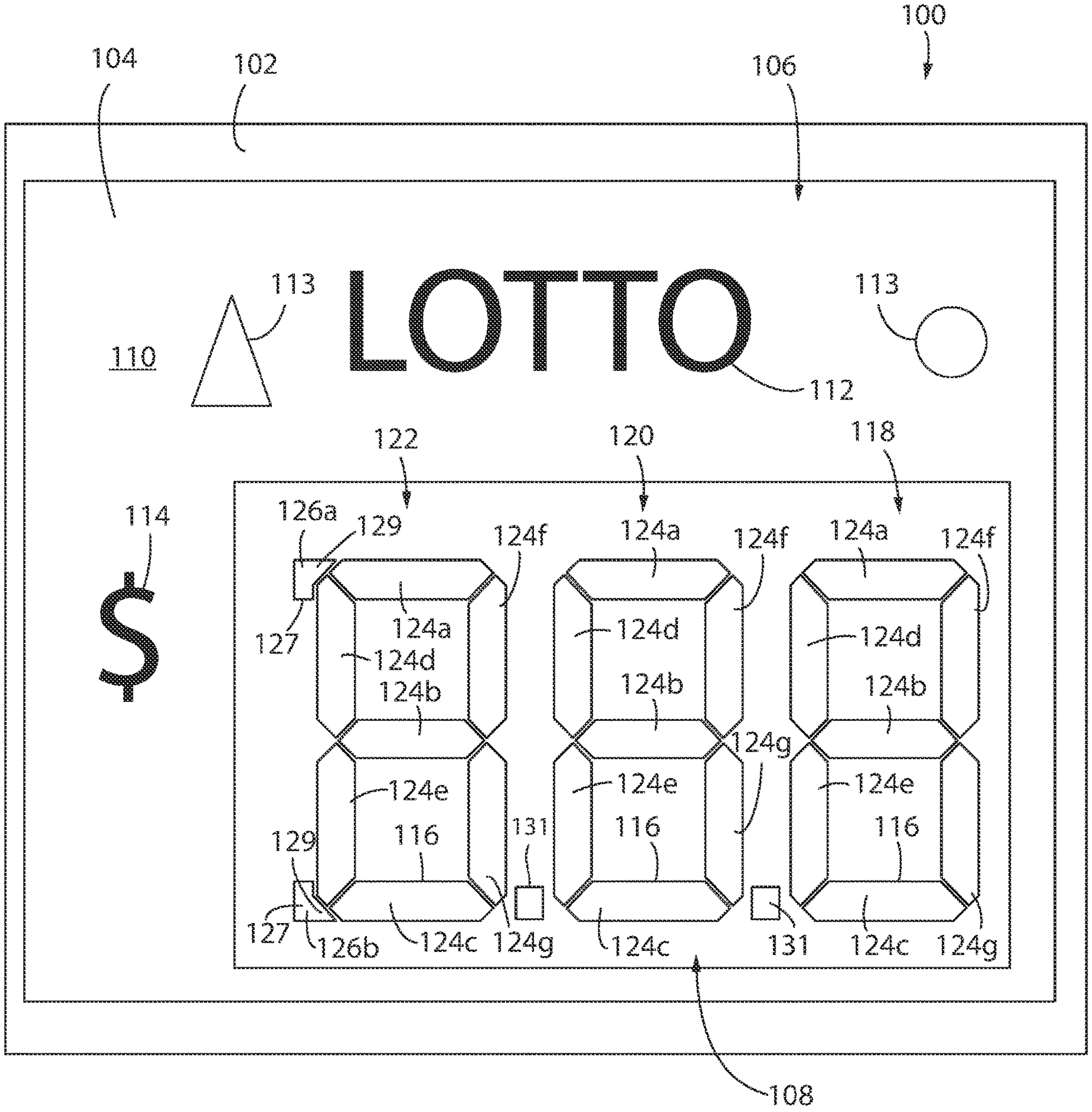
FIG. 1 is a front view of a lottery jackpot display sign in accordance with one embodiment of the present invention, which is not illuminated.

In describing the embodiments of the invention which are illustrated in the drawings, specific terminology is resorted to for the sake of clarity. However, it is not intended that the invention be limited to the specific terms so selected and it is to be understood that each specific term includes all technical equivalents which operate in a similar manner to accomplish a similar purpose.

DETAILED DESCRIPTION

A wide variety of numerical display could be used in accordance with the illuminated display as defined by the claims. Hence, while representative embodiments of the invention will now be described with reference to a lottery display, it should be understood that the invention is in no way so limited and other numerical displays may be used in accordance with the invention as defined by the claims.

Referring to FIGS. 1-5 and 11, and initially FIG. 1, there is shown a lottery display 100 that generally includes a frame 102 that extends around the perimeter of the display 100, a faceplate 104 disposed within the frame 102 forming a forward-facing surface 106 of the display 100 and a numerical display area, e.g., a jackpot display area 108 located within the faceplate 104.

In one exemplary embodiment of the present invention, the outer frame 102 may be formed of a perimeter portion of a housing 103 that extends rearwardly of the forward-facing surface 106 of the display 100. The display 100 may contain within the housing 103 electrical components of the display 100, including for example, a power source 105 or connector to receive a power source that supplies electrical power to a controller 107, that is in electrical communication with a radio receiver 109 such as a transceiver to receive a signal for selectively illuminating a backlight 115 and numerous alphanumeric character arrays 116. As briefly shown in FIG. 11 and will be described in further detail below, the signal for selectively illuminating a backlight 115 and numerous alphanumeric character arrays 116 within one or more jackpot display areas 108 may be transmitted wirelesses via an external transmitter 111, via any known wireless transmission protocol, including but not limited to radio frequency (RF), WiFi, Bluetooth, ZigBee, etc. Alternatively, the signal may be received directly via a wired connection to a computer, PC or network connected device 121.

Returning now to FIG. 1, the faceplate 104 may be affixed to the frame 102, or may be removably affixed to the frame 102 as to allow for the use of various interchangeable faceplates 104 in the display 100. As shown in FIG. 1, the faceplate 104 may include a front surface 110 including an indicia 112 printed or otherwise affixed thereto. The indicia 112 may include information regarding a lottery name, logo, etc. The front surface 110 of the faceplate 104 may also include one or more semitransparent printed graphic elements or visual enhancement overlays 113 that are configured to be illuminated by LEDs or an alternative backlight 115 source located within the housing of the display 100, which result in the forward-facing surface 106 generally and the visual enhancement overlays 113 being illuminated. While FIG. 1 illustrates the visual enhancement overlays 113 as geometric shapes, it should be understood that the overlays 113 are not so limited and may include a surface treatment that covers all or substantially all of the forward-facing surface 106 of the faceplate 104, graphics, and/or text. For example, the overlays 113 may include a decorative pattern disposed upon the forward-facing surface 106 of the faceplate 104 that is illuminated by the backlight 115 when the display 100 is in use. Alternatively, the overlays 113, as shown in FIG. 1, may be discretely located visual elements, such as logos. Furthermore, as shown in FIG. 1, the display 100 may also include a currency indicium 114 located adjacent the jackpot display area 108. As shown in FIG. 1, the currency indicium 114 may be a dollar sign "$" when the display 100 is configured for use in the United States. However, it should be understood that the present invention is not so limited and alternative currency indicium 114 may be included in the display 100, as is necessitated by the currency used in the country or region in which the display 100 is to be utilized.

The jackpot display area 108, as shown in FIG. 1, may be bordered by the faceplate 104. In one embodiment, the jackpot display area 108 may be a void in the faceplate 104 such that the backlight 115 does not illuminate the jackpot display area 108, or alternatively the jackpot display area 108 may be an area of the faceplate 104 that is devoid of printed graphic elements. In still another embodiment, the jackpot display area 108 may be defined by a distinct visual appearance, such as semitransparent color coating that is distinct from the remainder of adjacent front surface 110.

As shown in FIG. 1, the jackpot display area 108 includes a number of arrays 116, such as alphanumeric character arrays or numeric character arrays. While the arrays 116 are generally identified as alphanumeric character arrays it should be understood that the present invention further includes embodiments of the display 100 in which not all of the arrays 116 are of the alphanumeric character variety. That is to say, that the present invention is equally applicable to a display 100 having a jackpot display area 108 including a number of arrays 116 in which one or more are of the alphanumeric character array variety described below, i.e., including selectively illuminated first and second serifs 126*a*, 126*b*, and one or more of the arrays 116 are of the numeric character array variety, absent selectively illuminated first and second serifs 126*a*, 126*b*.

In one embodiment, the display 100 as shown in FIG. 1 includes three alphanumeric character arrays 116, disposed in a linear arrangement with one alphanumeric character array 116 located in a right-most or first position 118, one alphanumeric character array 116 located in a middle or second position 120, and one alphanumeric character array 116 located in a left-most or third position 122. That is to say that the display 100 of FIG. 1 is a three-digit display. However, it should be understood that the present invention is not limited to the use of three alphanumeric character arrays 116, and that other combinations of arrays 116, including but not limited to four or five alphanumeric character arrays 116, are considered within the scope of the present invention. Furthermore, it should also be understood that a display 100 may include a plurality of jackpot display areas 108 within the display 100. For example, the display 100 may provide between 1 and 10 jackpot display areas 108 in a stacked configuration such that each of the jackpot display areas 108, and its respective alphanumeric character arrays 116 displays a value of a discrete lottery jackpot within a single display 100. In one embodiment, the plurality of jackpot display areas 108 may be discretely located within the front surface 110 of the display 100. Alternatively, two or more of the jackpot display areas 108 may be positioned adjacent one another, to present an uninterrupted plurality of jackpot display areas 108 within the front surface 110 of the display 100.

Each of the alphanumeric character arrays 116 includes seven segments 124 including: a top horizontal segment 124*a*; a middle horizontal segment 124*b*; a bottom horizontal segment 124*c*; a top left segment 124*d*; a bottom left segment 124*e*; a top right segment 124*f*; and, a bottom right segment 124*g*. As shown in FIG. 1, the seven-line segments 124*a-g* are oriented to form the general shape of a figure "8", with segments 124*d* and 124*e* forming the left wall, segments 124*f* and 124*g* forming the right wall, and segments 124*a-c* forming the horizontal components that are generally perpendicular to the right and left walls. While the alphanumeric character arrays 116 shown in FIG. 1 includes seven segments 124, it should be understood that the present invention equally applies to alternative alphanumerical character arrays, such as those having twelve (12), fourteen (14), or more segments; all of which are considered within the scope of the present invention.

In use, as will be described in further detail below, the seven segments 124*a-g* of each of the alphanumeric character arrays 116 in the three positions 118, 120 and 122 may be individually illuminated. Accordingly, each of the alphanumeric character arrays 116 is capable of being illuminated in one of 128 different illumination states, based upon the variable combinations of segments 124*a-g* that are selectively illuminated at any given time. Moreover, within these combinations, each of the alphanumeric character arrays 116 in the three positions 118, 120 and 122 may be selectively illuminated to individually display numerical values corresponding from zero "0" to nine "9". Accordingly, in the display 100, where the lottery jackpot value to be displayed is in the millions of dollars, the array 116 in the first position 118 is representative of the millions place, the array 116 in the second position 120 is representative of the ten-millions place, and the array 116 in the third position is representative of the hundred-millions place. Therefore, collectively, the alphanumeric character arrays 116 in the three positions 118, 120 and 122 may be selectively illuminated to displays numerical values ranging from zero-zero-zero "000" to nine-nine-nine "999".

In one embodiment, each of the individual segments 124*a-g* may be formed of an individual LED strip or LCD, which is illuminated according to the user-selected number that is to be displayed in the corresponding array 116. In another embodiment of the invention, each array 116 may be formed of a panel of LEDs. Such an embodiment, in which each array 116 is formed of a panel of LEDs, is commonly referred to as a discrete LED display, in which each individual LED may be selectively illuminated. During use, only those LEDs that correspond to the required segments 124*a-g* in the discrete LED display are illuminated according to the user-selected number that is to be displayed in the corresponding array 116, as specified by the controller 107. The present invention is equally applicable to such discrete LED displays.

In addition to displaying numbers "000" through "999", corresponding to lottery jackpot values up to approximately nine hundred ninety-nine million, the jackpot display area 108 of the display 100 is configured to display an approximate lottery jackpot value of greater than or equal to one billion. The display of approximate jackpot values of equal to or greater than one billion utilizes the selective illumination of a first serif 126*a* and second serif 126*b* located adjacent a left side of one alphanumeric character array 116. As shown in FIG. 1, the first serif 126*a* may be located at the top-left corner of the array 116 in the third position 122, and more specifically extends outwardly from the array 116 and generally parallel to the top horizontal segment 124*a* and generally perpendicular to the top-left segment 124*d*. The second serif 126*b* is similarly positioned at the bottom-left corner of the same array 116 in the third position 122, and more specifically extends outwardly from the array and generally parallel to the bottom horizontal segment 124*c* and generally perpendicular to the bottom-left segment 124*e*. However, as described below, it should be understood that any one or more of the alphanumeric character arrays 116, at any location 118, 120, 122, may include the serifs 126*a*, 126*b*, and in fact, more than one alphanumeric character arrays 116 in the display 100 may include the serifs 126*a*, 126*b*.

In use, as will be described in further detail below, illumination of all seven segments 12*a-g* of the array 116 in the third position 122, along with illumination of the first and second serifs 126*a*, 126*b* results in the formation of a capital letter "B" displayed in the third position 122. That is to say that selective illumination of the first and second serifs 126*a*, 126*b* transforms the visual appearance of the fully illuminated array 116 from the number "8" to the capital letter "B". More specifically, as shown in FIG. 1, the serifs 126*a*, 126*b* may have an outer perimeter 127 that is generally irregularly pentagonal. The top serif 126*a* may include a projection extending from its upper right corner that is configured to be received at the upper left corner of the corresponding array 116, while the bottom serif 126*b*, which is a mirror of the top serif 126*a*, may include a projection 129 extending from its lower right corner that is configured to be received at the lower left corner of the corresponding array 116.

Figure 9:
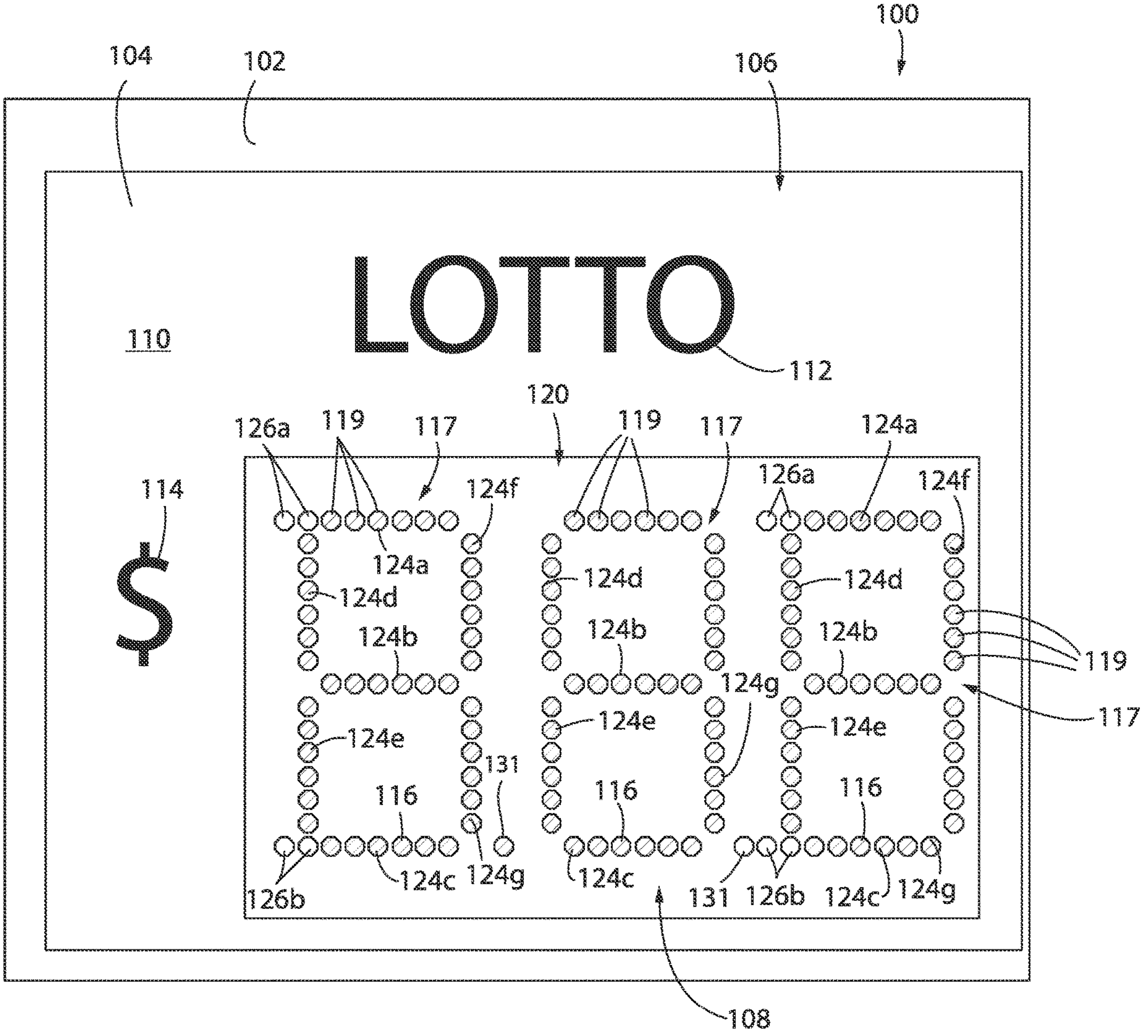
FIG. 9 is a front view of a non-illuminated three-digit display according to another embodiment of the invention having a dot matrix LED display area in one representative configuration, where the three digits have been selected to display the number "8" without illuminated top and bottom serifs on any digit and a decimal point located between the left-most digit and the middle digit have been illuminated.
Figure 10:
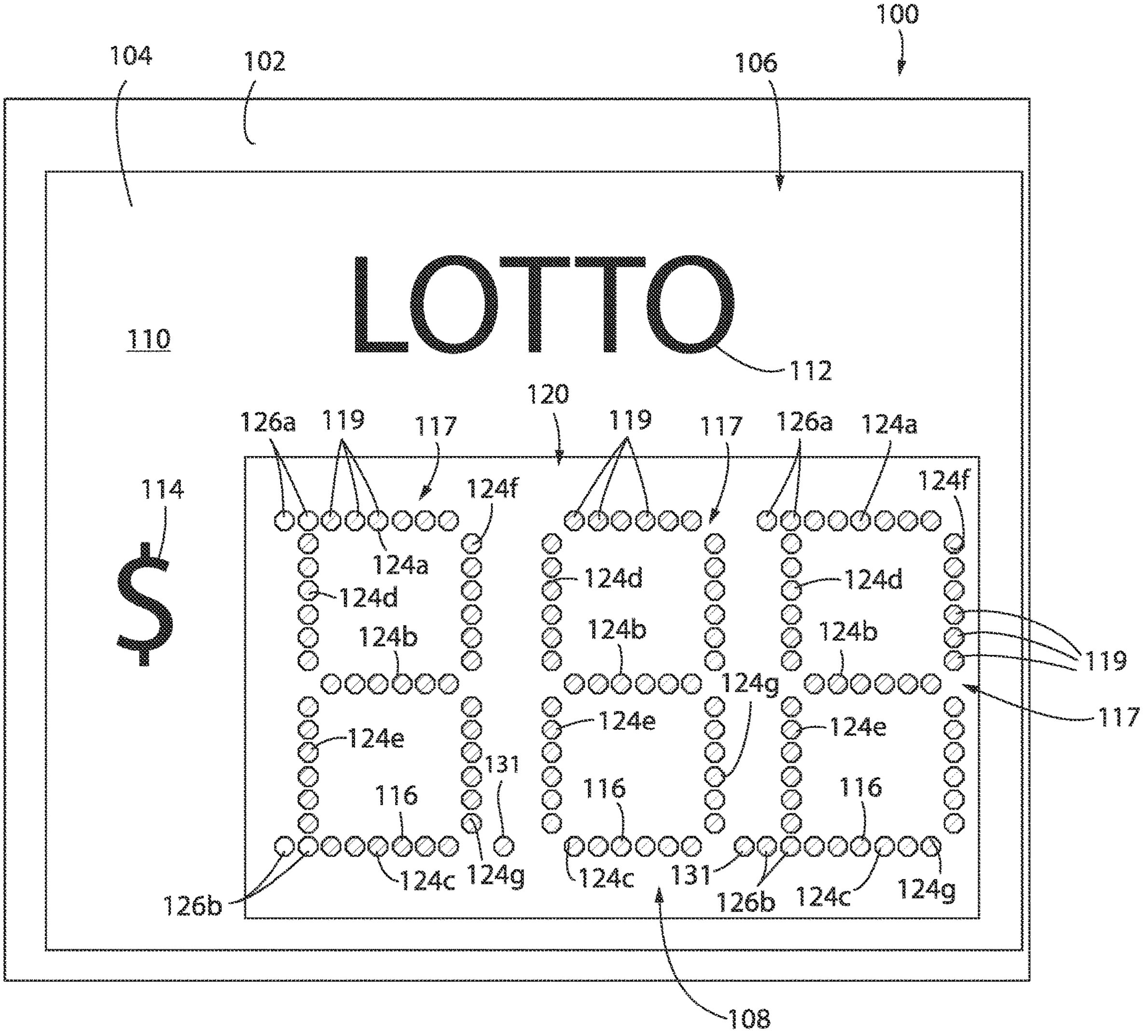
FIG. 10 is an alternative representative configuration of the display of FIG. 9, where the left-most digit and middle digit have been selected to display the number "8," a decimal point located between the left-most digit and the middle digit is illuminated, and the right-most digit is illuminated to display the letter "B" with top and bottom serifs illuminated; and, FIG. 11 is a block diagram showing components of a display according to one embodiment of the present invention.
Figure 11:
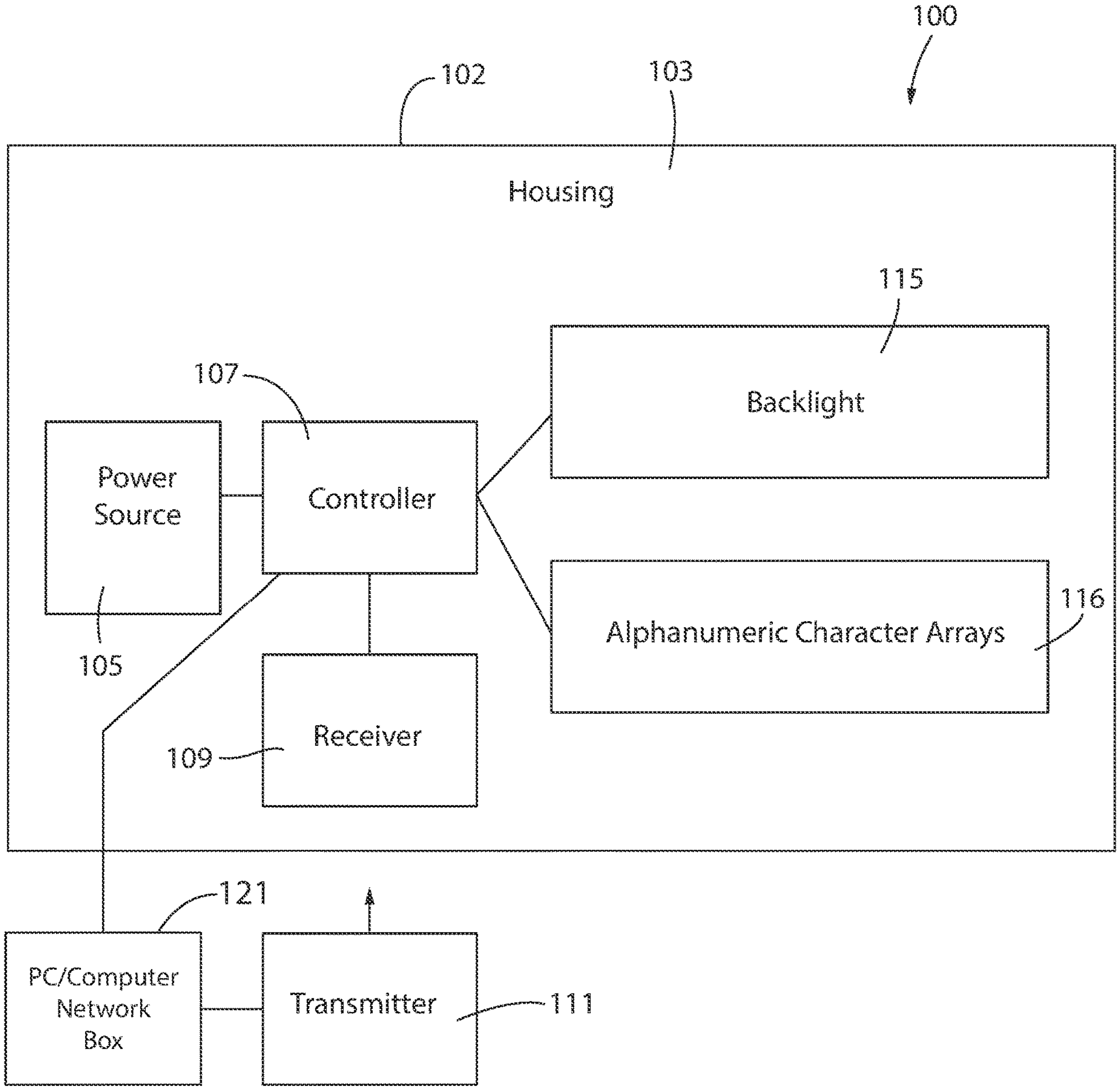

As with the segments 124*a-g*, each of the serifs 126*a*, 126*b* may be formed of an independent LED, LED strip or LCD, which is illuminated along with the segments 124*a-g* in the corresponding array 116 by a user that desires to display the capital letter "B". Alternatively, in another embodiment of the invention, as shown briefly in FIGS. 9 and 10, each of the serifs 126*a*, 126*b* may be formed within a dot matrix or panel of LEDs that are integral with the segments 124*a-g* of the corresponding array 116. In such an embodiment, all LEDs corresponding to both the segments 124*a-g* and the serifs 126*a*, 126*b* may be illuminated by a user that desires to display the capital letter "B". More specifically, as shown in FIG. 9, each array 116 is formed of a dot matrix 117 or panel of individual LEDs 119. The individual LEDs 119 which form the matrix 117 of each array 116 may be positioned to generally conform to the position of the segments 124*a-g* and the serifs 126*a*, 126*b* as described above. In such a configuration, the LEDs 119 in the matrix 117 of each array 116 may be selectively illuminated to display both numbers, as shown in the display of the selectively illuminated number "8.88" in FIG. 9 or a combination of numbers and the capital letter "B" as shown in FIG. 10, which is selectively illuminated to display "8.8 B".

Returning now briefly to FIG. 1, one or more selectively illuminated decimal points 131 may be provided in the display area 108. In FIG. 1, a first decimal point 131 is located between the first position 118 and the second position 120, and a second decimal point 131 is located between the second position 120 and the third position 122. Selective illumination of the decimal point 131 located between the first position 118 and the second position 120, in combination with illumination the letter "B" at the third position 122, which indicates a numerical value, i.e., lottery jackpot value in the billions, allows for the second position 120 to represent the billions value place and the first position 118 to represent the hundred-million value place. Alternatively, were the lottery jackpot value to be equal to or greater than ten billion, then the decimal place could be left in an "off" position, where the second position 120 would represent the ten-billions value place and the first position 118 would represent the billions value place. However, it should be understood that the preceding example is a nonlimiting example and the present invention is not limited to one decimal point 131, or to a location between the second position 120 and third position 122. Rather, the display 100 may include a decimal point 131 between, preceding and/or following each alphanumeric character display 116, or any combination of decimal points 131 at various locations within the display 100. The display 100, may also include a decimal point 131 between the first and second positions 118, 120, when the array 116 that includes adjacent first and second serifs 126*a*, 126*b*, is located in the first position 118. That is to say that the decimal point 131 will be located directly adjacent the second serif 126*b*. Still further, in such an embodiment wherein the array 116 includes adjacent first and second serifs 126*a*, 126*b* that are located in the first position 118, a portion of the second serif 126*b* may be selectively illuminated to appear as a decimal point 131. That is to say that the projection 129 of the second serif 126*b* extending from its lower right corner that is configured to be received at the lower left corner of the corresponding array 116 will not be illuminated resulting in the appearance of an illuminated rectangular shape.

While the decimal points 131 shown in FIGS. 1-8 are generally illustrated as a regular polygon, namely a rectangle, the present invention is not so limited. In one alternative embodiment, the decimal point may also be a circle, as shown by LEDs 119 in FIGS. 9 and 10.

Figure 2:
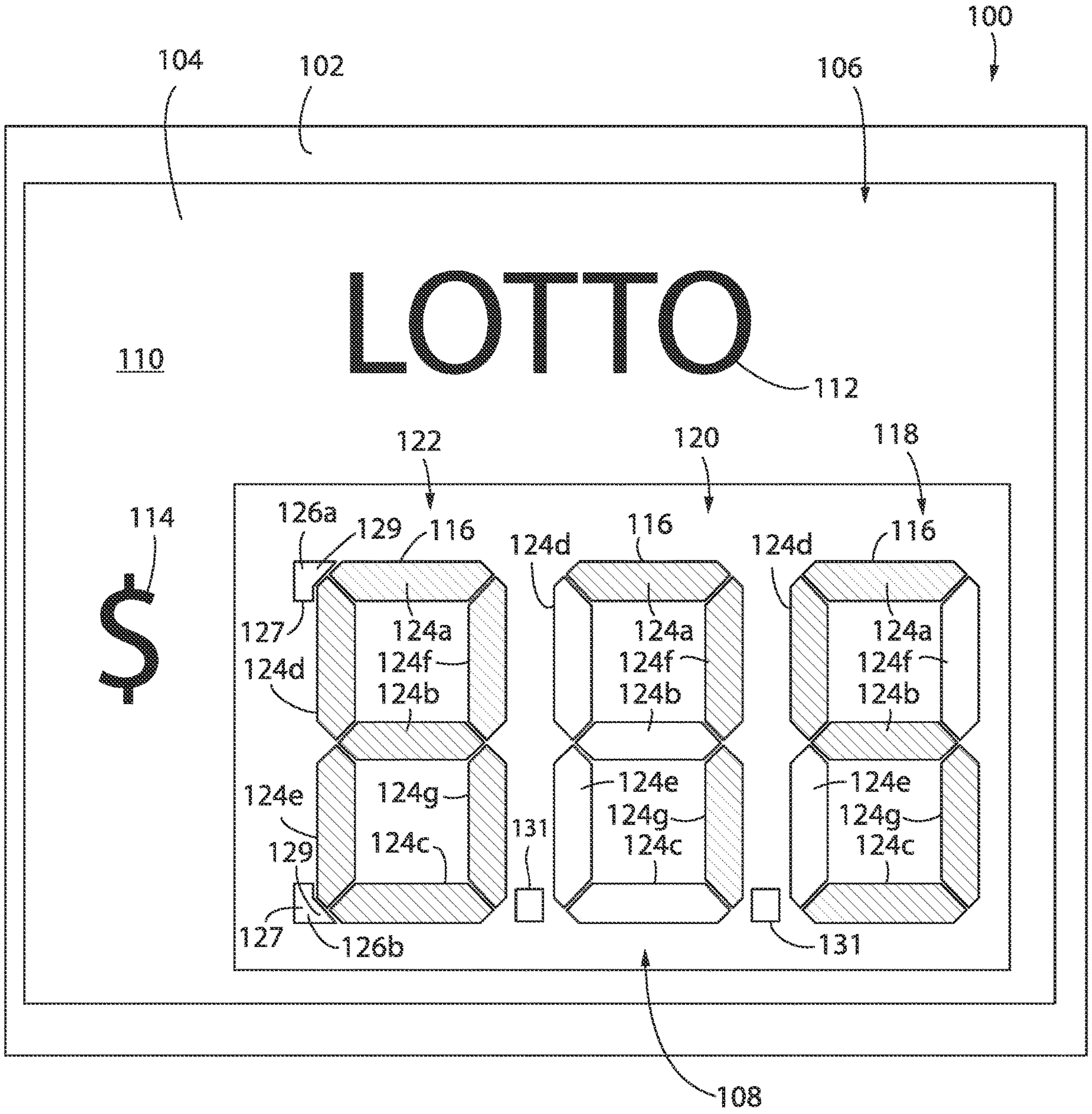
FIG. 2 is a front view of the lottery jackpot display sign of FIG. 1 in one representative configuration, where the display has been selectively illuminated to indicate a lottery jackpot of approximately $875,000,000.

Turning now to FIG. 2, a representative example of the display 100 is shown in use, while displaying a lottery jackpot value of approximately $875,000,000.00. In this configuration of the display 100, the array 116 in the third position 122 depicts the number "8" with all segments 124*a-g* illuminated. The array 116 in the second position 120 depicts the number "7" with segments 124*a*, 124*f*, and 124*g* illuminated. Lastly, the array 116 in the first position 118 depicts the number "5" with segments 124*a*, 124*b*, 124*c*, 124*d*, and 124*g* illuminated. The serifs 126*a*, 126*b* and the decimal point 131 are not illuminated in FIG. 2.

Figure 3:
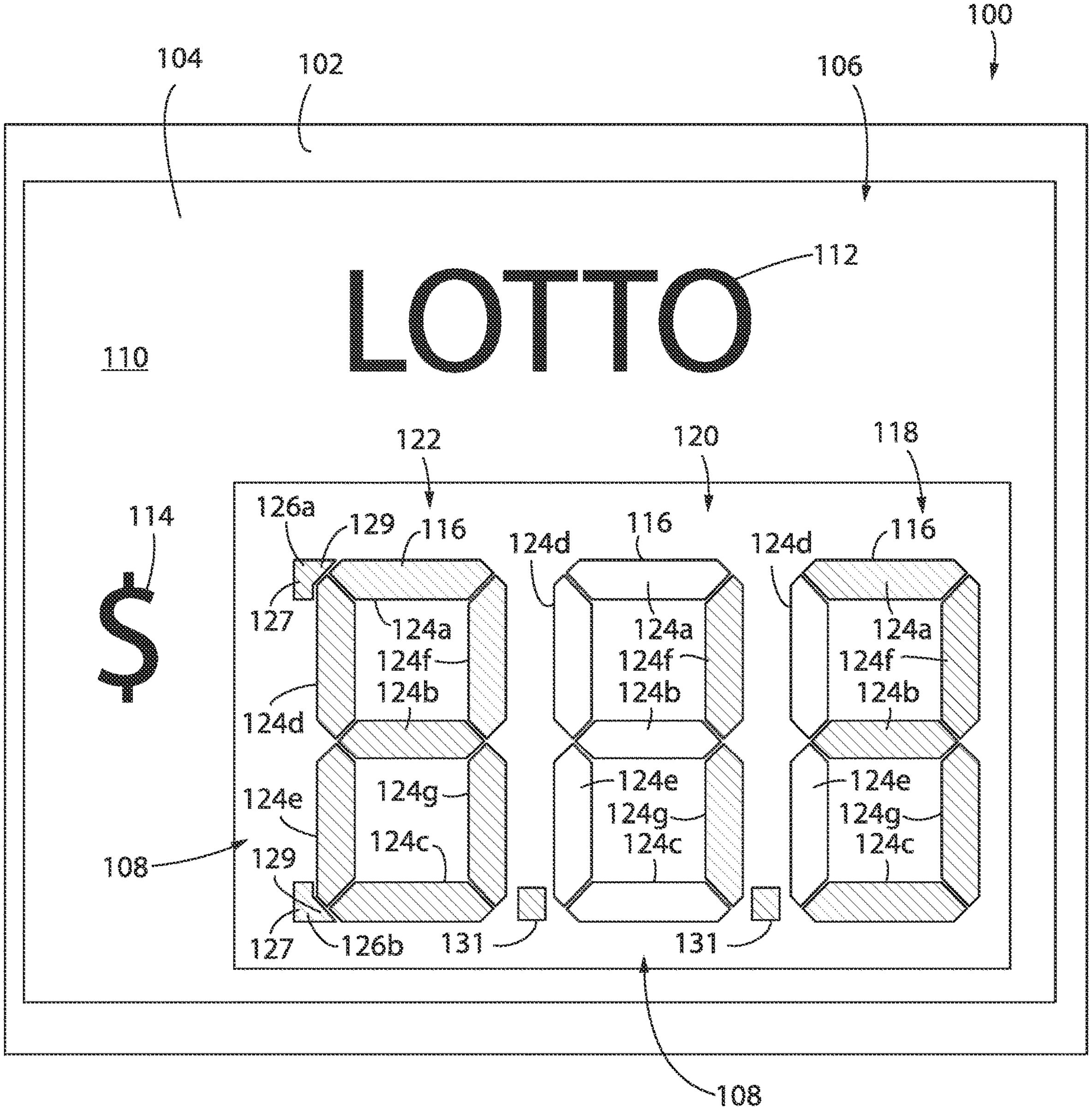
FIG. 3 is a front view of the lottery jackpot display sign of FIG. 1 in one representative configuration, where the display has been selectively illuminated to indicate a lottery jackpot of approximately $1,300,000,000 and the left-most digit includes illuminated serifs to form a capital letter "B"

Turning now to FIG. 3, the display 100, which is similar to that of FIG. 2, is shown in use in an alternative illumination configuration, while displaying a lottery jackpot value of approximately $1,300,000,000.00. In this configuration of the display 100, the array 116 in the third position 122 depicts the capital letter "B" with the first and second serifs 126*a*, 126*b* and all segments 124*a-g* illuminated. The array 116 in the second position 120 depicts the number "1" with segments 124*f*, and 124*g* illuminated. The decimal point 131, which is located between the first position 118 and the second position 120 is illuminated. Lastly, the array 116 in the first position 118 depicts the number "3" with segments 124*a*, 124*b*, 124*c*, 124*f*, and 124*g* illuminated.

Figure 4:
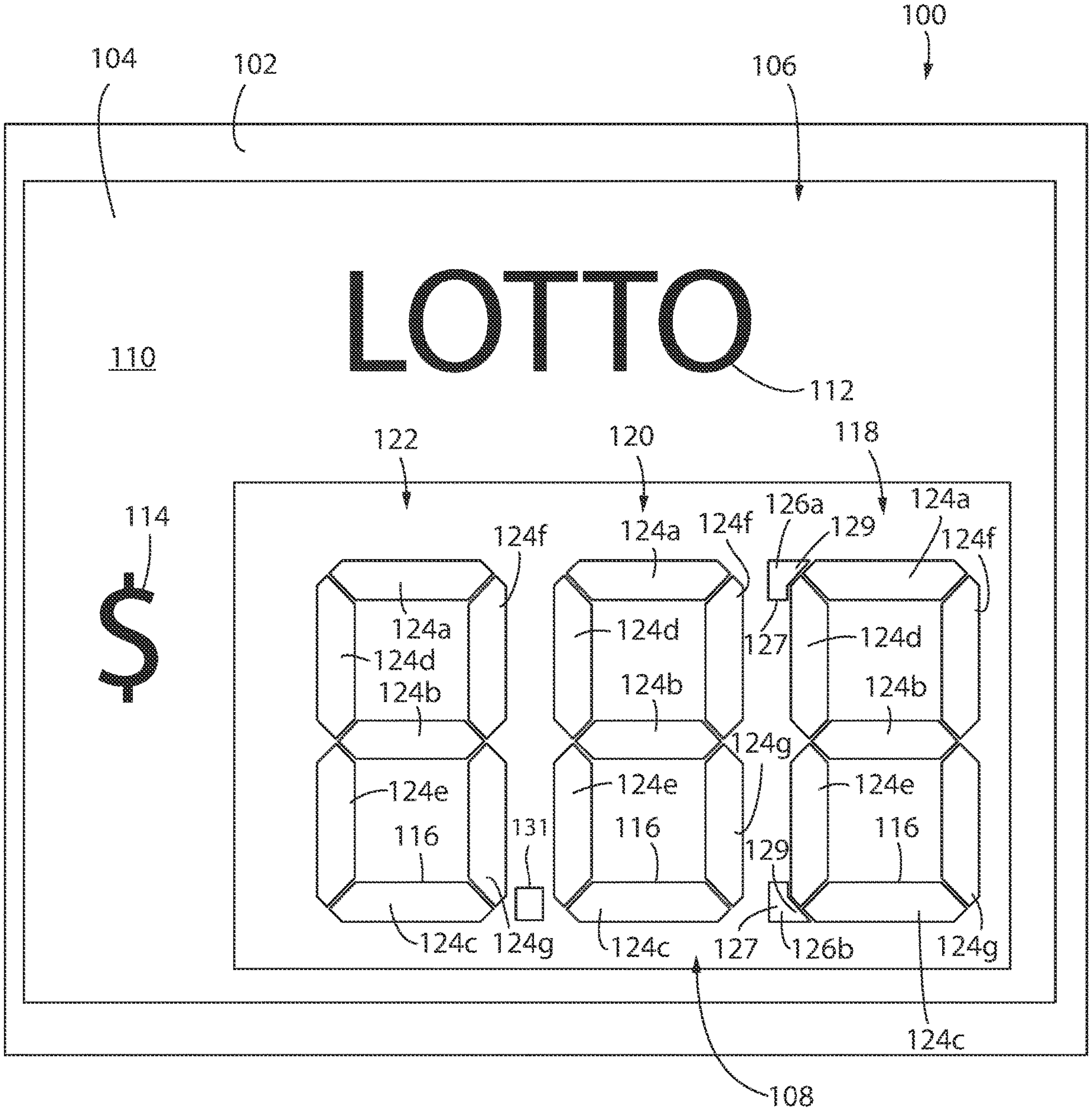
FIG. 4 is a front view of an alternative embodiment of the display sign of FIG. 1, including a non-illuminated three-digit display according to one embodiment of the invention including a decimal point between the left-most digit and the middle digit, and top and bottom serifs on the right most digit.

FIGS. 1-3, as described above are directed to an embodiment of the present invention in which the array 116 in the third position 122 includes the first and second serifs 126*a*, 126*b* such that the third position 122 may be selectively illuminated to depict the capital letter "B", a first decimal point 131 is located between the first position 118 and the second position 120, and a second decimal point 131 is located between the first position 118 and the second position 120. However, as indicated above, the current invention in not so limited. In an alternative embodiment as shown in FIG. 4, the display 100 may include a single decimal point 131 located between located between the first position 118 and the second position 120, and the first and second serifs 126*a*, 126*b* at the array 116 in the first position 118, such that the array 116 in the first position 118 may be selectively illuminated to depict the capital letter "B".

Figure 5:
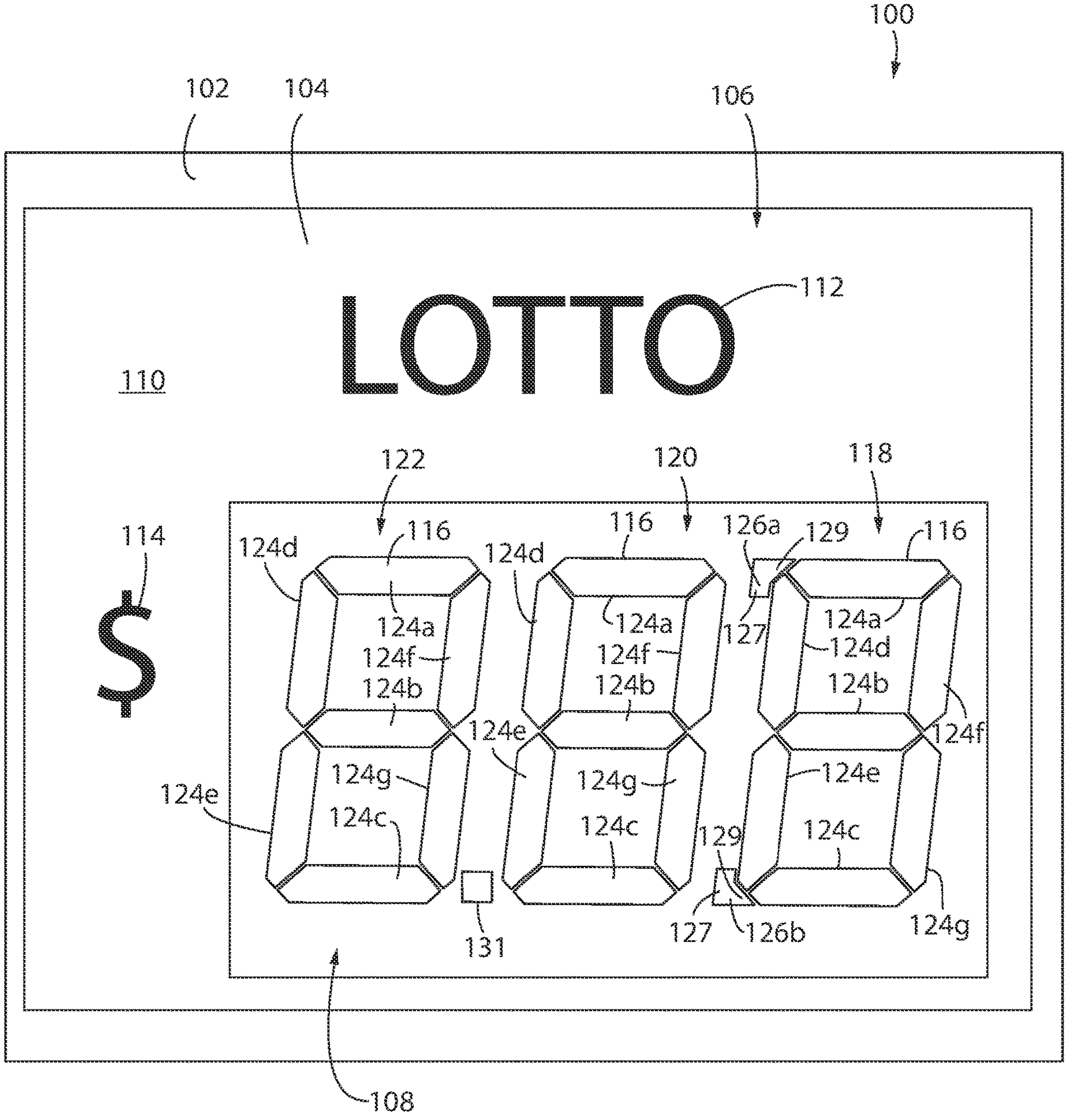
FIG. 5 is a front view of an alternative embodiment of the display sign of FIG. 1, including a non-illuminated three-digit display according to one embodiment of the invention having italic or slanted digits, including a decimal point between the left-most digit and the middle digit, and top and bottom serifs on the right most digit.
Figure 6:
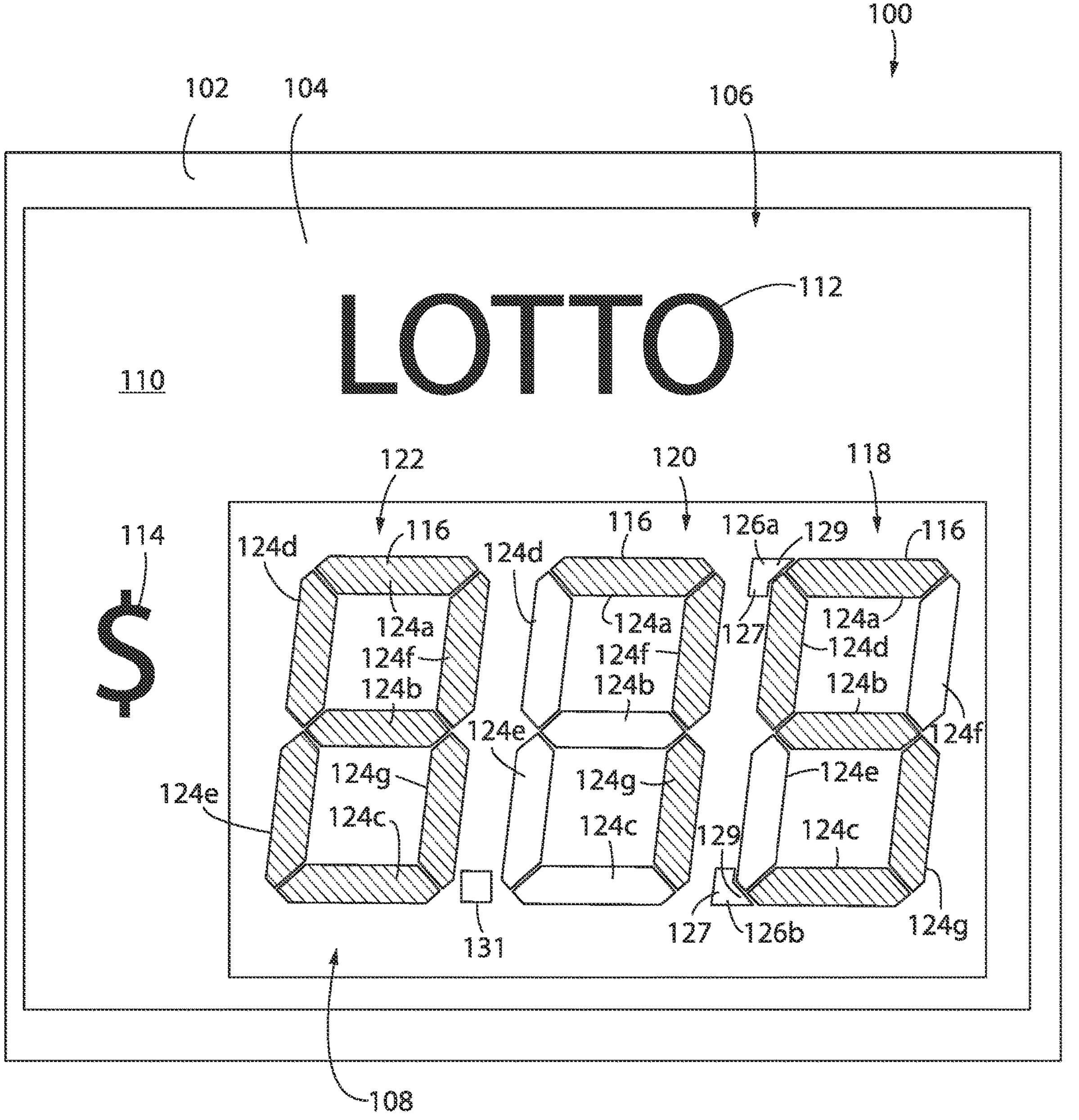
FIG. 6 is a front view of the lottery jackpot display sign of FIG. 5 in one representative configuration, where the display has been selectively illuminated to indicate a lottery jackpot of approximately $875,000,000.
Figure 7:
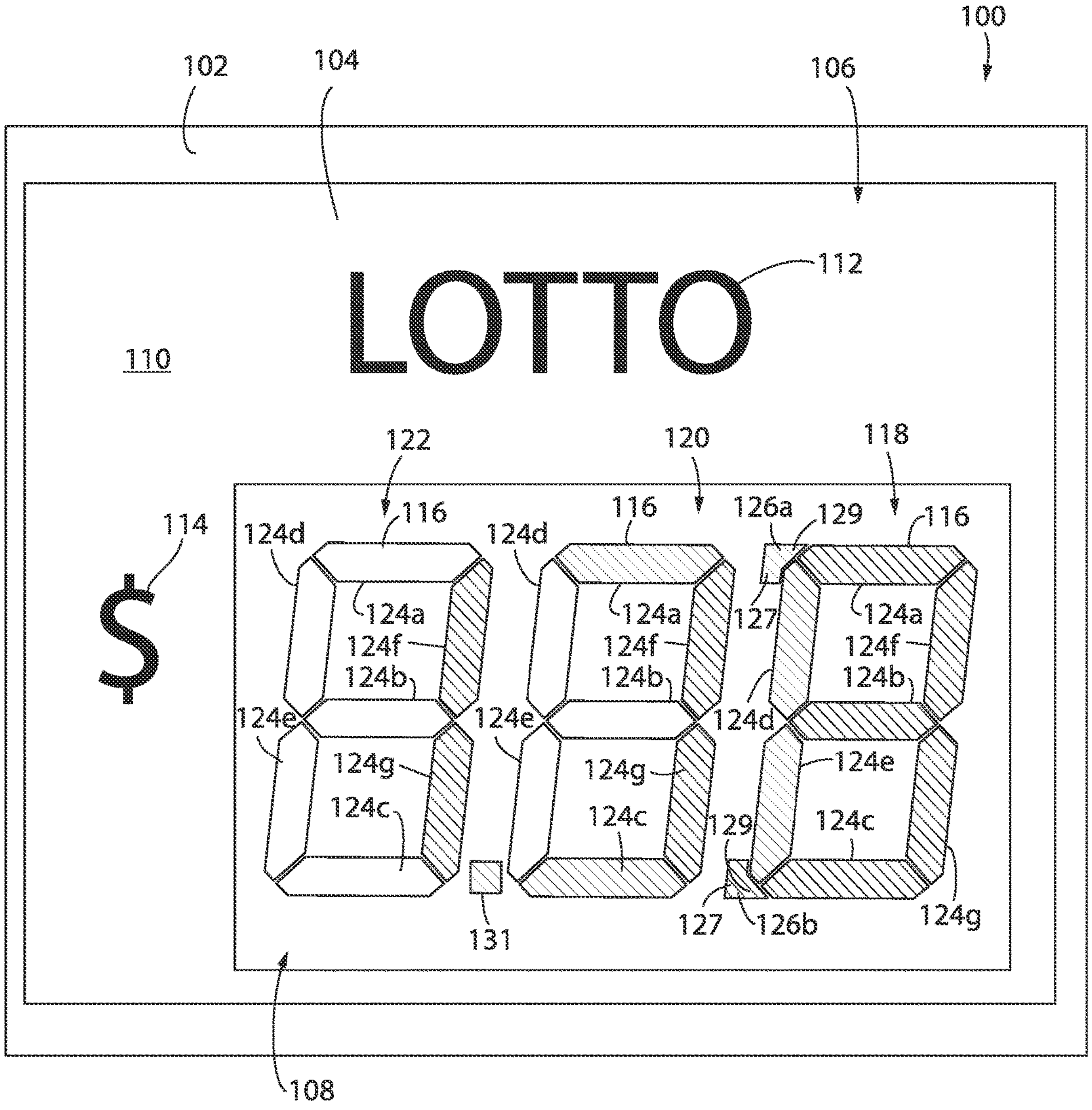
FIG. 7 is a front view of the lottery jackpot display sign of FIG. 5 in one representative configuration, where the display has been selectively illuminated to indicate a lottery jackpot of approximately $1,300,000,000 and the right-most digit includes illuminated serifs to form a capital letter "B"

In still another example of the present invention, the alphanumeric character arrays 116 and/or decimal points 131 may be slanted or italicized as shown in FIGS. 5-7. More specifically, in this alternative embodiment of the present invention the display 100 includes a display area 108 having alphanumeric character arrays 116 in the first second and third positions 118, 120, 122 that are slanted or italicized. That is to say that the upright segments 124*d-g* of the arrays 116 are not vertical, i.e., perpendicular to segments 124*a-c* of the arrays 116. While FIGS. 5-7 illustrate one alternative embodiment of the present invention, in which the alphanumeric character arrays 116 and/or decimal points 131 are shown in an italic typeface, it should also be understood that alternative visual distinctions may also be applied to the alphanumeric character arrays 116 and/or decimal points 131, including but not limited to thin or narrow typeface, bold or wide typeface, oblique, underlined, etc.

While FIGS. 5 through 7 generally correspond to previously described FIGS. 1 through 3, in FIGS. 5 through 7 the array 116 that is configured to form the capital letter "B", i.e., the array 116 that includes adjacent first and second serifs 126*a*, 126*b*, has been relocated to the first position 118. In this alternative orientation of the display 100, a single decimal point 131 as also present between the second position 120 and the third position.

Figure 8:
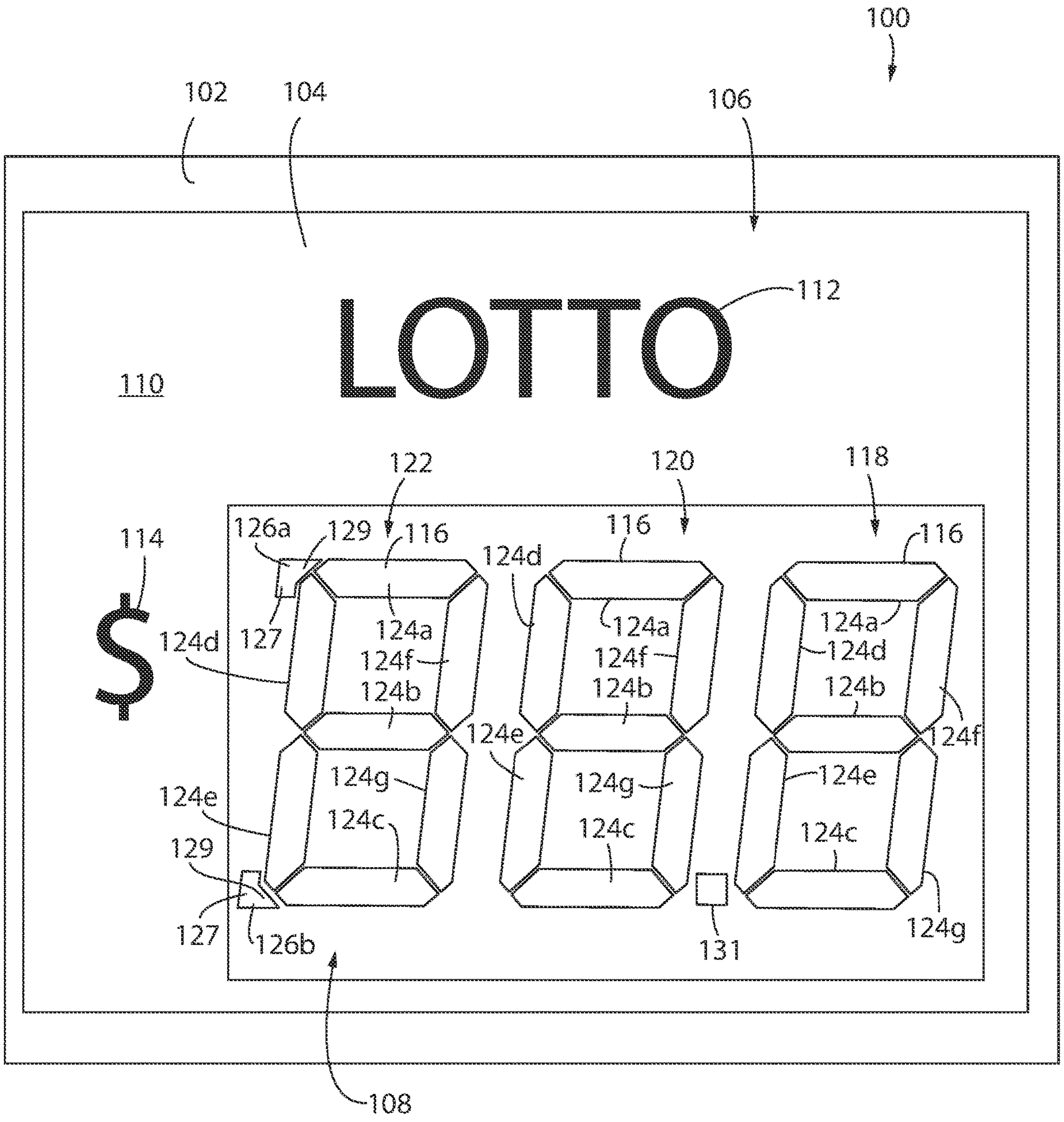
FIG. 8 is a front view of a non-illuminated three-digit display according to another embodiment of the invention having italic or slanted digits, including a decimal place between the right-most digit and the middle digit, and top and bottom serifs on the left most digit.

While FIGS. 5 through 7 depict alternative locations for serifs 126*a*, 126*b*, and the decimal point 131, as well as the use of italicized alphanumeric character arrays 116, it should be understood that any combination or order of these features are considered well within the scope of the present invention. By way of nonlimiting example, FIG. 8 shows yet another alternative orientation of the display 100 in which the first and second serifs 126*a*, 126*b* are located to the third position 122, a single decimal point 131 is present between the arrays 116 of the first position 118 and the second position 120, and arrays 116 are italicized.

In another nonlimiting example, as was briefly described above, FIGS. 9 and 10 show yet another alternative orientation of the display 100 in which each array 116 within the display area 108 is formed of a dot matrix 117 or panel that is formed of individual LEDs 119. The individual LEDs 119 which form the matrix 117 of each array 116 may be positioned to generally conform to the position of the segments 124*a-g* and the serifs 126*a*, 126*b* as previously described. While FIGS. 9 and 10 show one embodiment in which each of the segments 124*a-g* are formed of six LEDs disposed within a linear arraignment, it should be understood that alternative numbers of LEDs are considered well within the scope of the invention. That is to say that each segment 124*a-g* and serif 126*a*, 126*b* may be formed of any number of discrete LEDs 119. For example, as shown in FIGS. 9 and 10, the serifs 126*a*, 126*b* are each formed of two discrete LEDs 199. In such a configuration, the LEDs 119 in the matrix 117 of each array 116 may be selectively illuminated to display both numbers, as shown in the display of the selectively illuminated number "8.88" in FIG. 9 or a combination of numbers and the capital letter "B" as shown in FIG. 10, which is selectively illuminated to display "8.8 B".

However, while the controller 107 may selectively illuminate all LEDs 119 within one or more segments 124*a-g* and/or serifs 126*a*, 126*b* to create the appearance of illuminated numerical digits or the capitol letter "B" as was described above, the embodiment of the present invention shown in FIGS. 9 and 10 is not so limited. Alternatively, the controller 107 may selectively illuminated any combination of one or more LEDs 119 at any location within the arrays 116 at the first, second or third positions 118, 120, 122. Such selective illumination of individual LEDs 119 may provide for the display of additional character patterns, such as various letters within the arrays 116. Still further, the LEDs 119 many not be limited to continuous illumination but may be sequentially illuminated to display scrolling text or other changing characters in the display area 108.

It should further be understood that the invention is not limited in its application to the details of construction and arrangements of the components set forth herein. While the disclosure was provided in the context of a lottery jackpot display sign, it should be appreciated that the present invention is not so limited and may apply to other display applications. The invention is capable of other embodiments and of being practiced or carried out in various ways. Variations and modifications of the foregoing are within the scope of the present invention. It is also understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. An illuminated display, comprising:

a housing defining a display area;

an alphanumeric array in the display area, comprising a plurality of light emitting segments; wherein selective illumination of individual segments collectively displays a single digit number in the alphanumeric array, and a first and second light emitting serif; wherein illumination of a plurality of the segments of the alphanumeric array and the first and second light emitting serif displays a capital letter "B" in the alphanumeric array;

wherein the serifs are located outside a perimeter formed by selectively illuminated ones of the light emitting segments.

2. The illuminated display of claim 1, further comprising a plurality of numeric arrays in the display area, each array comprising a plurality of light emitting segments; wherein selective illumination of segments collectively displays a single digit number in each array.

3. The illuminated display of claim 2, wherein the illuminated display is a lottery jackpot display and the illumination of the numeric arrays and the alphanumeric array corresponds to an approximate lottery jackpot value.

4. The illuminated display of claim 2, wherein the display area comprises a first and second numeric array.

5. The illuminated display of claim 4, further comprising a light emitting decimal point disposed between the alphanumeric array and one of the numeric arrays from the plurality of numeric arrays.

6. The illuminated display of claim 4, further comprising a light emitting decimal point disposed between the first and second numeric array.

7. The illuminated display of claim 2, wherein the plurality of numeric arrays and the alphanumeric array are formed of a plurality of LEDs disposed within a dot matrix panel.

8. The illuminated display of claim 1, wherein the first and second serifs are disposed adjacent a left edge of the alphanumeric array.

9. The illuminated display of claim 8, wherein the first serif is disposed at a corner defined by the intersection of the left edge of the alphanumeric array and a top edge of the alphanumeric array.

10. The illuminated display of claim 8, wherein the second serif is disposed at a corner defined by the intersection of the left edge of the alphanumeric array and a bottom edge of the alphanumeric array.

11. The illuminated display of claim 1, wherein the first and second serifs are irregular polygons.

12. The illuminated display of claim 1, wherein the display area is disposed within and at least partially bordered by a light emitting faceplate and, wherein the display further comprises an LED backlight providing a source of light emitted from the faceplate.

13. An illuminated lottery jackpot display, comprising:

a housing having a front side;

a light emitting faceplate removably disposed at the front side of the housing, the faceplate having a void therein defining a lottery jackpot display area;

a plurality of numeric arrays in the lottery jackpot display area;

each array comprising a series of light emitting segments; wherein selective illumination of segments collectively displays a single digit number in each array; and an alphanumeric array in the display area, comprising a series of light emitting segments; wherein selective illumination of individual segments collectively displays a single digit number in the alphanumeric array, a first and second light emitting serif; wherein illumination of more than one segment of the alphanumeric array and the first and second light emitting serif displays a capital letter "B" in the alphanumeric array, the serifs located outside a perimeter formed by selectively illuminated ones of the light emitting segments, and at least one light emitting decimal point disposed between the arrays.

14. The illuminated lottery jackpot display of claim 13, wherein the lottery jackpot display area comprises a first and second numeric array.

15. The illuminated lottery jackpot display of claim 13, wherein the first and second serifs are disposed adjacent a left edge of the alphanumeric array.

16. The illuminated lottery jackpot display of claim 15, wherein the first serif is disposed at a corner defined by the intersection of the left edge of the alphanumeric array and a top edge of the alphanumeric array.

17. The illuminated lottery jackpot display of claim 15, wherein the second serif is disposed at a corner defined by the intersection of the left edge of the alphanumeric array and a bottom edge of the alphanumeric array.

18. The illuminated lottery jackpot display of claim 13, wherein the first and second serifs are irregular polygons.

19. An illuminated lottery jackpot display, comprising:

a housing having a front side;

a light emitting faceplate removably disposed at the front side of the housing, the faceplate having a void therein defining a lottery jackpot display area;

the lottery jackpot display area comprising:

a first numeric array comprising a series of light emitting segments; wherein selective illumination of a plurality of the segments collectively displays a single digit number in the first numeric array;

a second numeric array comprising a series of light emitting segments; wherein selective illumination of a plurality of the segments collectively displays a single digit number in the second numeric array;

an alphanumeric array comprising a series of light emitting segments; wherein selective illumination of a plurality of the segments collectively displays a single digit number in the alphanumeric array, a first light emitting serif disposed at a corner defined by an intersection of a left edge of the alphanumeric array and a top edge of the alphanumeric array, a second light emitting serif disposed at a corner defined by an intersection of the left edge of the alphanumeric array and a bottom edge of the alphanumeric array; wherein illumination of a plurality of the segments of the alphanumeric array and the first light emitting serif and second light emitting serif displays a capital letter "B" in the alphanumeric array.

20. The illuminated display of claim 19, further comprising a light emitting decimal point.

* * * * *